United States Patent [19]
Adams et al.

[11] Patent Number: 6,134,704
[45] Date of Patent: Oct. 17, 2000

[54] INTEGRATED CIRCUIT MACRO APPARATUS

[75] Inventors: John S. Adams, Colchester; Grant L. Clarke, Jr., Jericho; Kenneth J. Goodnow, Essex Junction; Scott W. Gould; Sebastian T. Ventrone, both of So. Burlington, all of Vt.

[73] Assignee: International Business Machines Corporation, Armonk, N.Y.

[21] Appl. No.: 09/054,459

[22] Filed: Apr. 3, 1998

[51] Int. Cl.[7] .................................................. G06F 17/50
[52] U.S. Cl. ............................................ 716/17; 257/208
[58] Field of Search ................... 395/500.02, 500.19; 716/1–21; 257/208–211; 326/37–50

[56] References Cited

U.S. PATENT DOCUMENTS

| | | | |
|---|---|---|---|
| 5,475,583 | 12/1995 | Bock et al. ............................... | 700/12 |
| 5,499,192 | 3/1996 | Knapp et al. ............................. | 716/17 |
| 5,633,806 | 5/1997 | Yusa et al. ............................... | 716/16 |
| 5,761,078 | 6/1998 | Fuller et al. ............................. | 716/16 |
| 5,946,478 | 8/1999 | Lawman .................................. | 716/17 |

FOREIGN PATENT DOCUMENTS

| | | | |
|---|---|---|---|
| 3-050848 | 3/1991 | Japan ............................ | H01L 21/82 |
| 3-60053 | 3/1991 | Japan ............................ | H01L 21/82 |
| 5-175334 | 7/1993 | Japan ............................ | H01L 21/82 |
| 6-196670 | 7/1993 | Japan ............................ | H01L 21/118 |
| 5-267454 | 10/1993 | Japan ............................ | H01L 21/82 |
| 5-335527 | 12/1993 | Japan ............................ | H01L 27/118 |
| 5-36829 | 12/1993 | Japan ............................ | H01L 21/82 |
| 7-263631 | 10/1995 | Japan ............................ | H01L 27/04 |

*Primary Examiner*—Paul R. Lintz
*Assistant Examiner*—Phallaka Kik
*Attorney, Agent, or Firm*—Schmeiser, Olsen & Watts; Eugene I. Shkurko

[57] ABSTRACT

An apparatus comprising a base macro, with fixed timing, surrounded by, and connected to, at least one selectable feature macro. The features of the apparatus may be selectively provided by connecting one or more of the selectable feature macros to the base macro.

24 Claims, 5 Drawing Sheets

INTEGRATED CIRCUIT MACRO APPARATUS

FIELD OF THE INVENTION

This invention is in the field of integrated circuits. More specifically, the present invention is directed to a complex hard macro having adjustable features provided by selectable feature hard macros.

BACKGROUND OF THE INVENTION

To reduce the design requirements of application specific integrated circuits (ASIC), libraries of complex components (e.g., "macros") have been developed. These macros can include microprocessors, digital signal processors, bus translators, analog and digital translations, and the like.

Because of the complexity of many macros, different operational features may be required by different users. In a soft macro (one which is synthesized from a high-level description to gate-level), such operational features can be selected by enabling different flags or switches in the high-level description. Unfortunately, soft macros cannot be automatically synthesized, and cannot meet the timing requirements necessary for many high speed applications. For example, although a user may be able to synthesize a processor from a high level description, the resultant processor speed may be inadequate.

The typical solution to the speed deficiencies associated with soft macros is to layout, wire, and fix the physical design of the macro, thereby producing a "hard macro." However, with a hard macro, the macro's features are fixed and, in order to satisfy a wide variety of customer design requirements, many hard macros of the same function must be designed with slightly different features. Clearly, this is an inefficient design method which is not much better than a fully custom design.

The prior art method of providing a plurality of hard macros in a library is generally adequate as long as the complexity of the macros is low enough to preclude the need for customer specific design changes. Correspondingly, the use of soft macros is generally adequate as long as the final circuit speed is not an issue.

SUMMARY OF THE INVENTION

In order to overcome the deficiencies of the prior art, the present invention provides a hard macro comprising a base macro, with fixed timing, surrounded by, and connected to, at least one selectable feature macro. The features of the hard macro may be adjusted by connecting one or more of the feature macros to the base macro. Advantageously, the present invention allows the creation of a library of high speed base macros which are feature configurable through the physical placement and connection of specific feature macros.

Generally, the present invention provides an apparatus to comprising:

a base macro surrounded by a plurality of generic connection points, the generic connections points being connectable to corresponding connection points on any one of a plurality of selectable feature macros, wherein a connection of at least one of the selectable feature macros to the base macro determines a circuit function performed by the apparatus.

BRIEF DESCRIPTION OF THE DRAWINGS

The objects and features of the present invention will best be understood from a detailed description of preferred embodiments thereof selected for the purposes of illustration and shown in the accompanying drawings, in which.

DETAILED DESCRIPTION OF THE PREFERRED EMBODIMENTS

Figure 1:
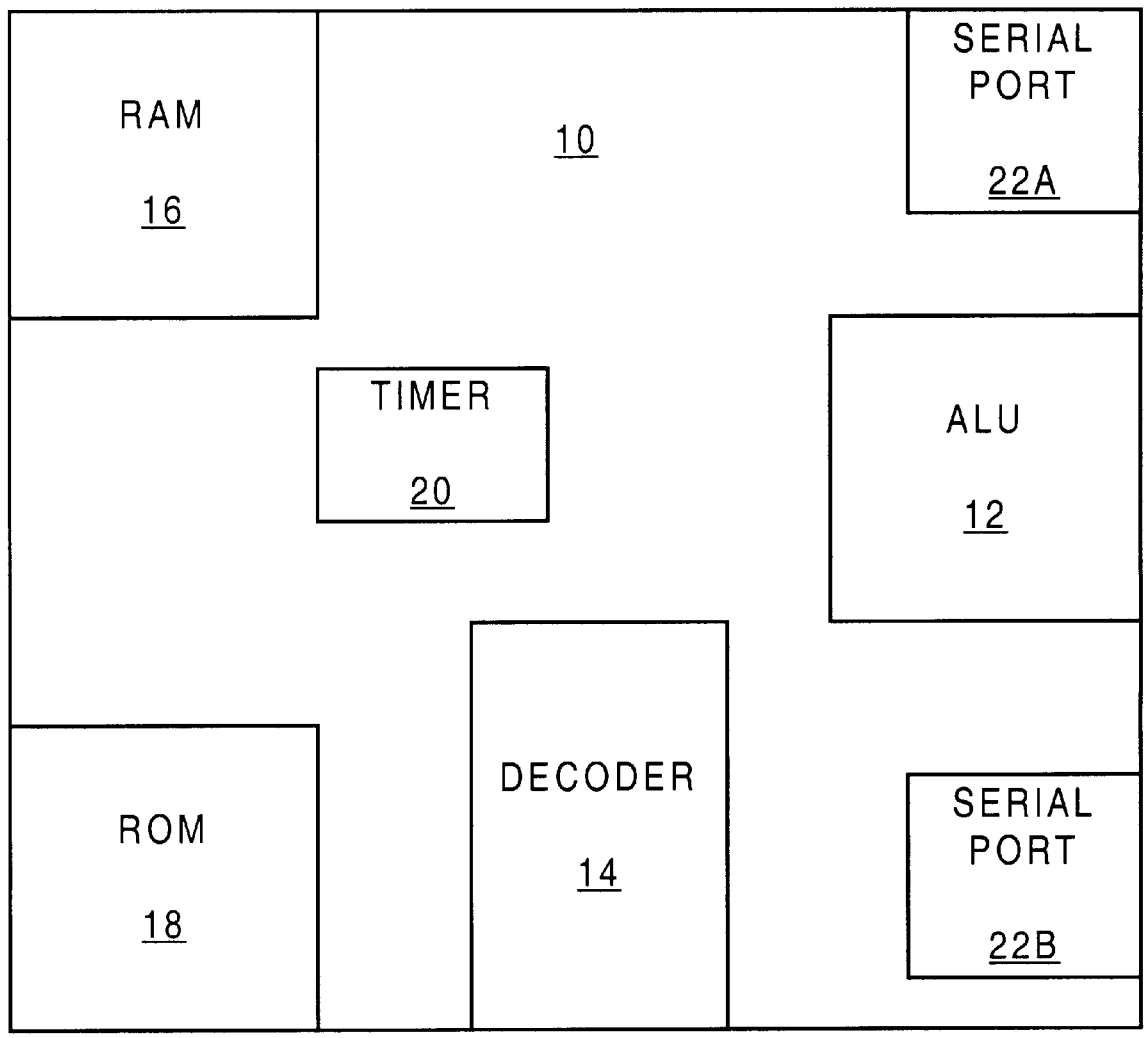
FIG. 1 illustrates a prior art hard macro.

In the drawings, like reference numerals refer to like elements.

Referring first to FIG. 1, there is illustrated a hard macro 10 having fixed features and layout. The hard macro 10 is a processor of a type known in the art having an arithmetic logic unit (ALU) 12, decoder 14, random access memory (RAM) 16, read only memory (ROM) 18, timer 20, and a pair of serial ports 22A, 22B. As previously detailed, the features of the hard macro 10 are fixed. Thus, if a customer requires additional RAM or an additional serial port, for example, the hard macro must be redesigned to incorporate these modifications.

Figure 2:
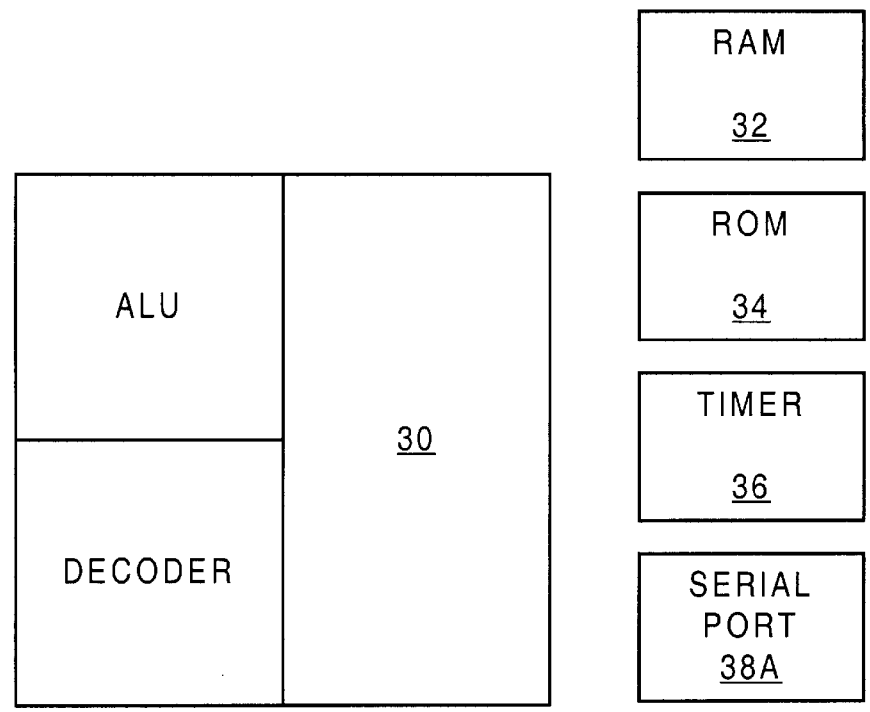
FIG. 2 illustrates a base macro and a plurality of feature macros which may be connected together in accordance with the present invention to form a hard macro similar to that of FIG. 1.

In accordance with the present invention, the hard macro 10 may be provided using the components shown in FIG. 2. The macro components include a base macro 30, comprising an ALU and decoder, having fixed timing, and a plurality of feature macros including RAM 32, ROM 34, timer 36, and serial ports 38A and 38B. The feature macros 32, 34, 36, 38A, and 38B, may be placed around, and connected to, the base macro 30 to produce a hard macro 40 (FIG. 3) having the same operational characteristics as the hard macro 10. However, unlike the hard macro 10, the features provided by the combination of the base macro 30 and the feature macros 32, 34, 36, 38A, and 38B, may easily be modified by adding, deleting, and/or substituting feature macros.

Figure 3:
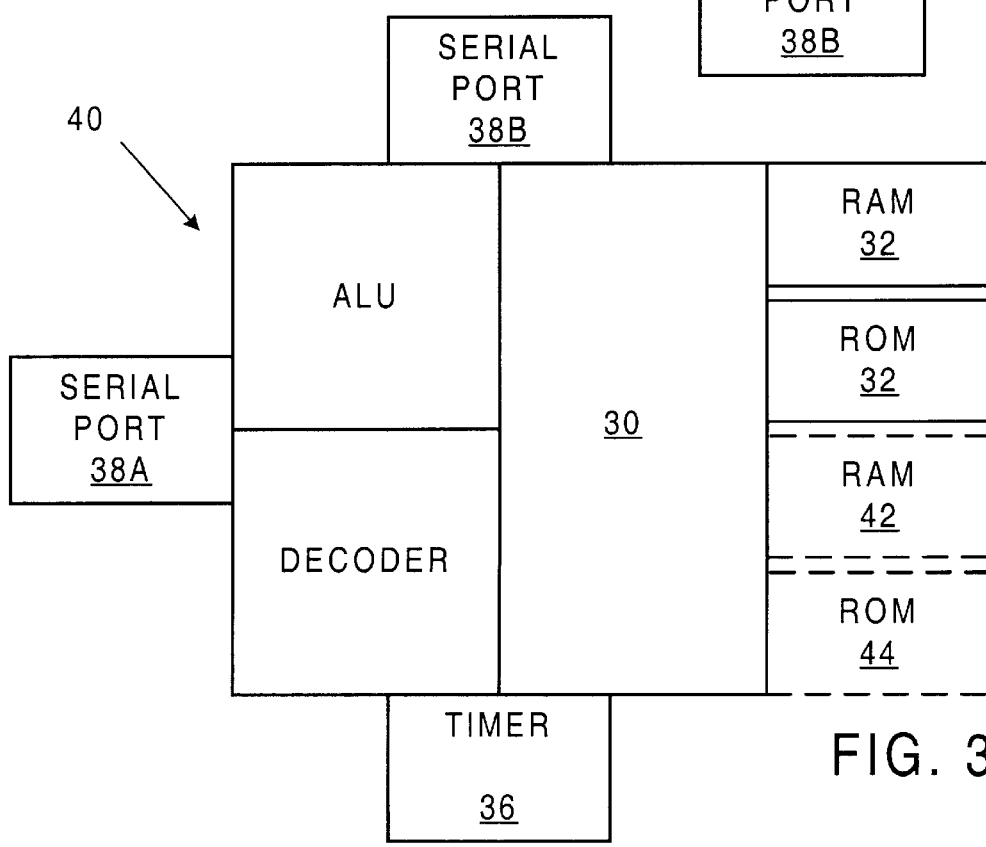
FIG. 3 illustrates the resultant hard macro formed through the physical placement and connection of the plurality of feature macros shown in FIG. 2 to the base macro.

The hard macro 40 produced in accordance with the present invention is illustrated in FIG. 3. As shown, the plurality of feature macros 32, 34, 36, 38A, 38B are positioned about the periphery of the base macro 30. Preferably, the connections between the various feature macros and the base macro 30 are provided by overlaying an appropriate conductive path (e.g., metal, polysilicon, diffusion) at corresponding locations on both the base macro 30 and the feature macros.

Unlike the prior art hard macro 10, additional features can be added to the hard macro 40 simply by positioning and connecting additional feature macros around the base macro 30. For example, as shown in phantom in FIG. 3, feature macros 42 and 44 have been coupled to the base macro 30 to provide the hard macro 40 with addition RAM and ROM, respectively. Feature macros may also be removed and/or substituted for one another to modify the characteristics of the hard macro 40. Different feature macros may also be connected in the same locations on different base macros. Clearly, the use of feature macros as described in the present invention provide ASIC manufacturers with a tremendous degree of design flexibility.

Figure 4:
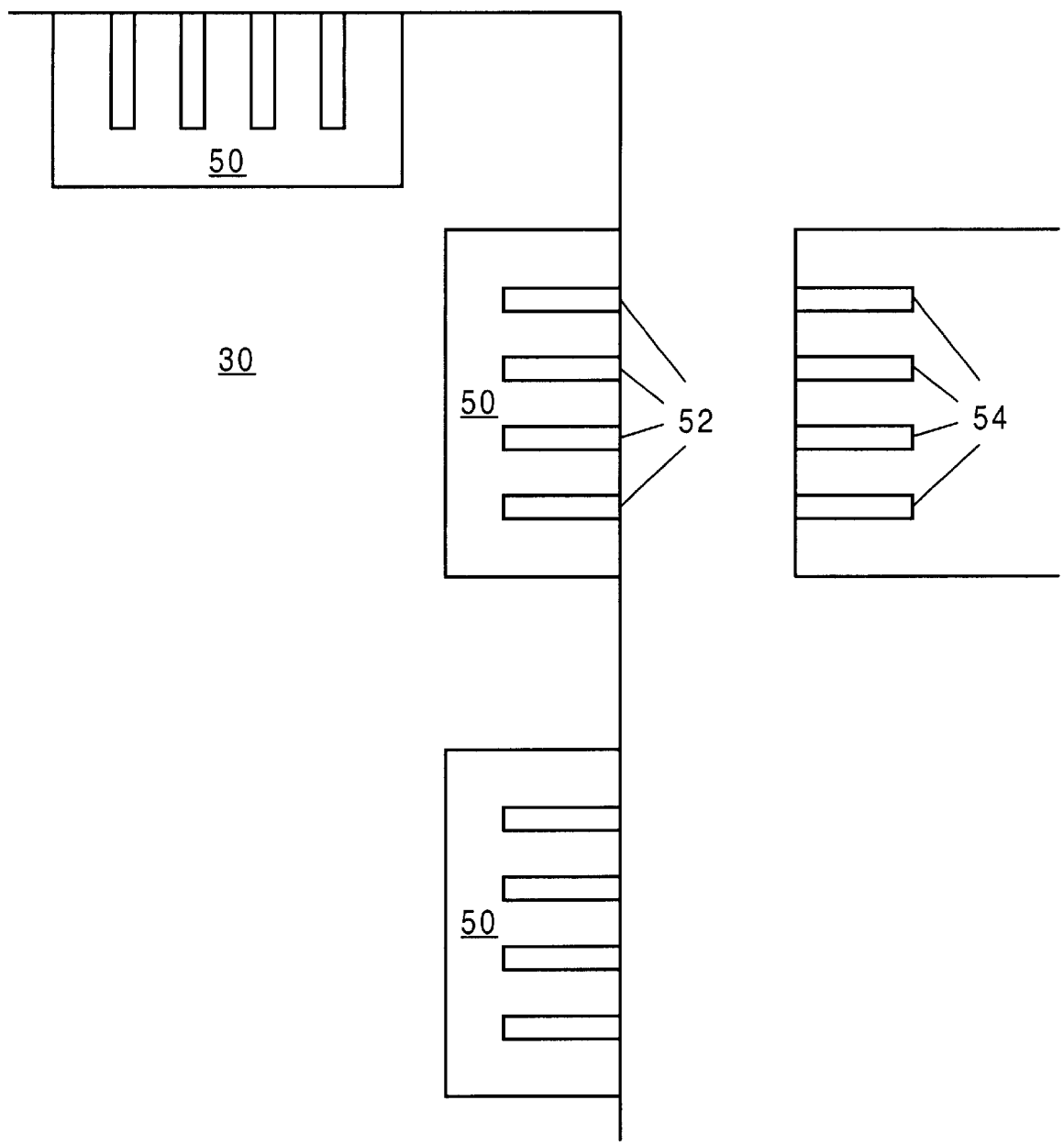
FIG. 4 shows the connectivity between a base macro and a feature macro in accordance with a preferred embodiment of the present invention.

The connectivity between a feature macro and the base macro 30 is provided by a plurality of ports 50 disposed near an edge of the base macro 30 as illustrated in FIG. 4. Each port 50 preferably includes a plurality of connection points 52, each used for a specific purpose when connected to corresponding connection points 54 on a feature macro. A number of the ports 50 may be disposed about the periphery of the base macro 30 as shown in FIG. 4, or in other locations on the base macro 30, to provide for the connection of a plurality of feature macros to the base macro 30. The actual number of feature macros attached to the base macro depends upon the desired functionality of the resultant hard macro 40, as well as other criteria.

Figure 5:
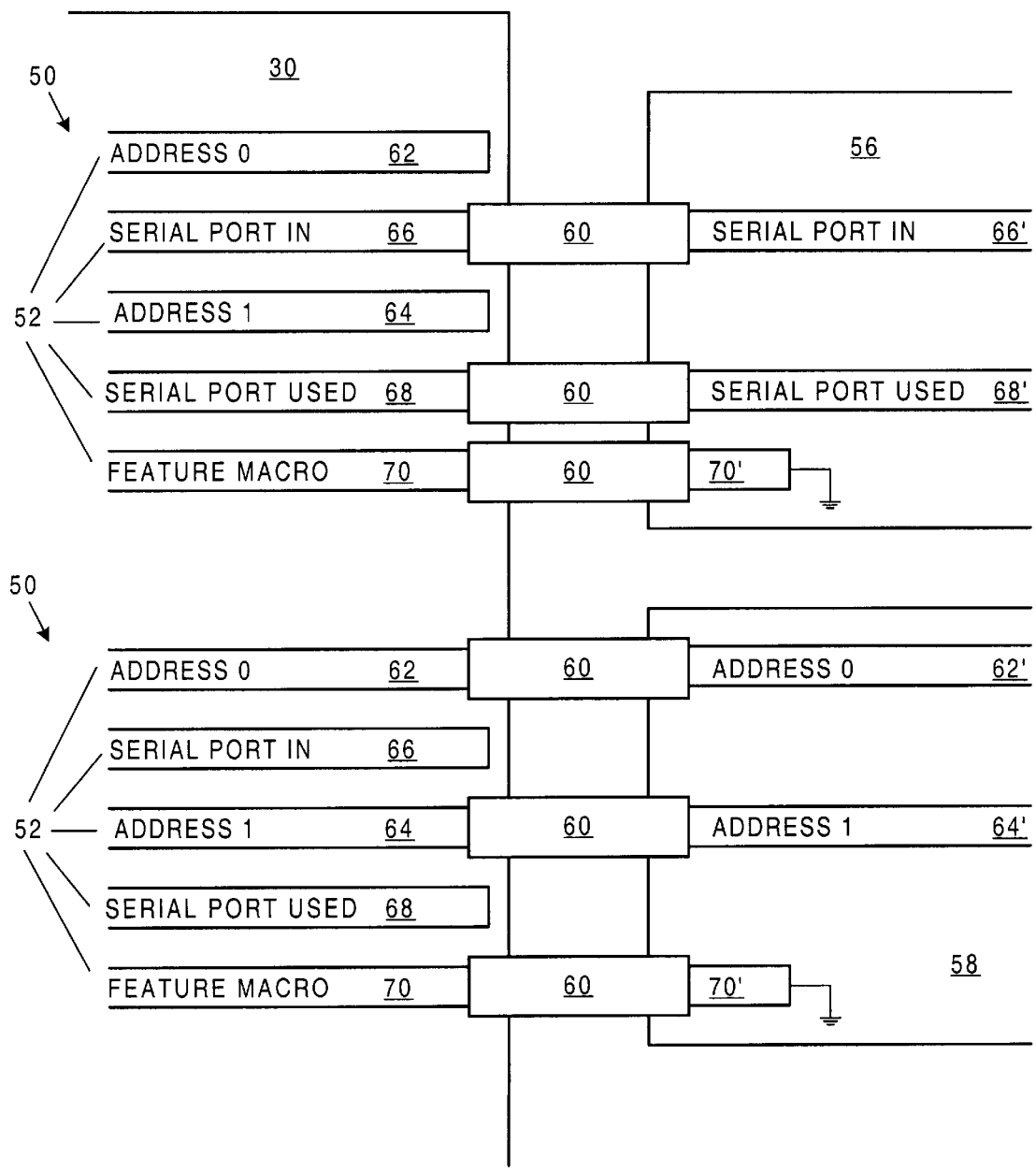
FIG. 5 illustrates an example of a hard macro formed in accordance with the present invention.

An example of the above-described connectivity is illustrated in FIG. 5. As shown, the connection points 52 of each port 50 on the base macro 30 include a pair of address lines, ADDRESS LINE 0 62, ADDRESS LINE 1 64, a serial port, SERIAL PORT IN 66, a serial port use line, SERIAL PORT USED 68, and a line indicating that a feature macro is coupled to the port 50, FEATURE MACRO PRESENT 70. Preferably, each port 50 includes an identical set of connection points 52. Of course, other types/numbers of connection points 52 may also be used without departing from scope of the present invention.

The feature macros that are attachable to the base macro 30 include corresponding connection points 54. Each of the connection points 54 is associated with one of the connection points 52 of each port 50. The feature macro connection points 54 in this example include ADDRESS LINE 0 62', ADDRESS LINE 1 64', SERIAL PORT IN 66', SERIAL PORT USED 68', and FEATURE MACRO PRESENT 70'. The FEATURE MACRO PRESENT 70' connection point is preferably connected to either GND or Vdd in the feature macro to indicate to the base macro 30 that a feature macro is present at a port 50.

In FIG. 5, first and second feature macros 56, 58, are connected to the base macro 30 at respective ports 50. The feature macros 56, 58 are overlaid upon, or positioned adjacent to, the base macro 30 such that corresponding ones of the connection points are adjacent one another. The connection points 54 required for a specific feature macro are connected to corresponding connection points 52 of the base macro 30 by overlaying a conductive path 60 therebetween in a manner known in the art. In a typical ASIC manufacturing process, for example, the connection points of the base macro and the feature macro may be formed as a single line with no break in it, thereby forming the required conductive path.

Feature macro 56 provides the base macro 30 with a serial port. This functionality is effected by connecting the SERIAL PORT IN 66, SERIAL PORT USED 68, and FEATURE MACRO PRESENT 70 connection points 52 of a first port 50 on the base macro 30 to the SERIAL PORT IN 66', SERIAL PORT USED 68', and FEATURE MACRO PRESENT 70' connection points, respectively, of the feature macro 56, using a plurality of conductive paths 60. The remaining connection points of the base macro 30, namely the ADDRESS LINE 0 62, ADDRESS LINE 1 64, are not overlain with a conductive path, and thus are not connected to the feature macro 56.

In a similar manner, feature macro 58 provides the base macro 30 with a memory. The feature macro 58 is coupled to the base macro 30 by connecting the ADDRESS LINE 0 62, ADDRESS LINE 1 64, and FEATURE MACRO USED 70 connection points 52 of a second port 50 on the base macro 30 to the ADDRESS LINE 0 62', ADDRESS LINE 1 64', and FEATURE MACRO USED 70' connection points, respectively, of the feature macro 58. The SERIAL PORT IN 66 and SERIAL PORT USED 68 connection points 52 on the base macro are unconnected.

Figure 6:
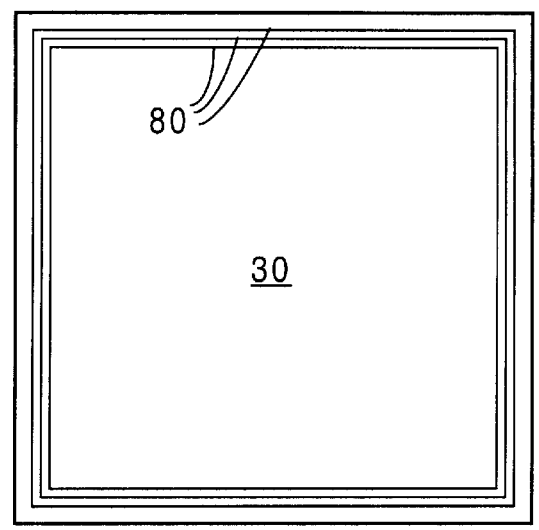
FIGS. 6 and 7 illustrate an alternative method for connecting a feature macro to a base macro.
Figure 7:
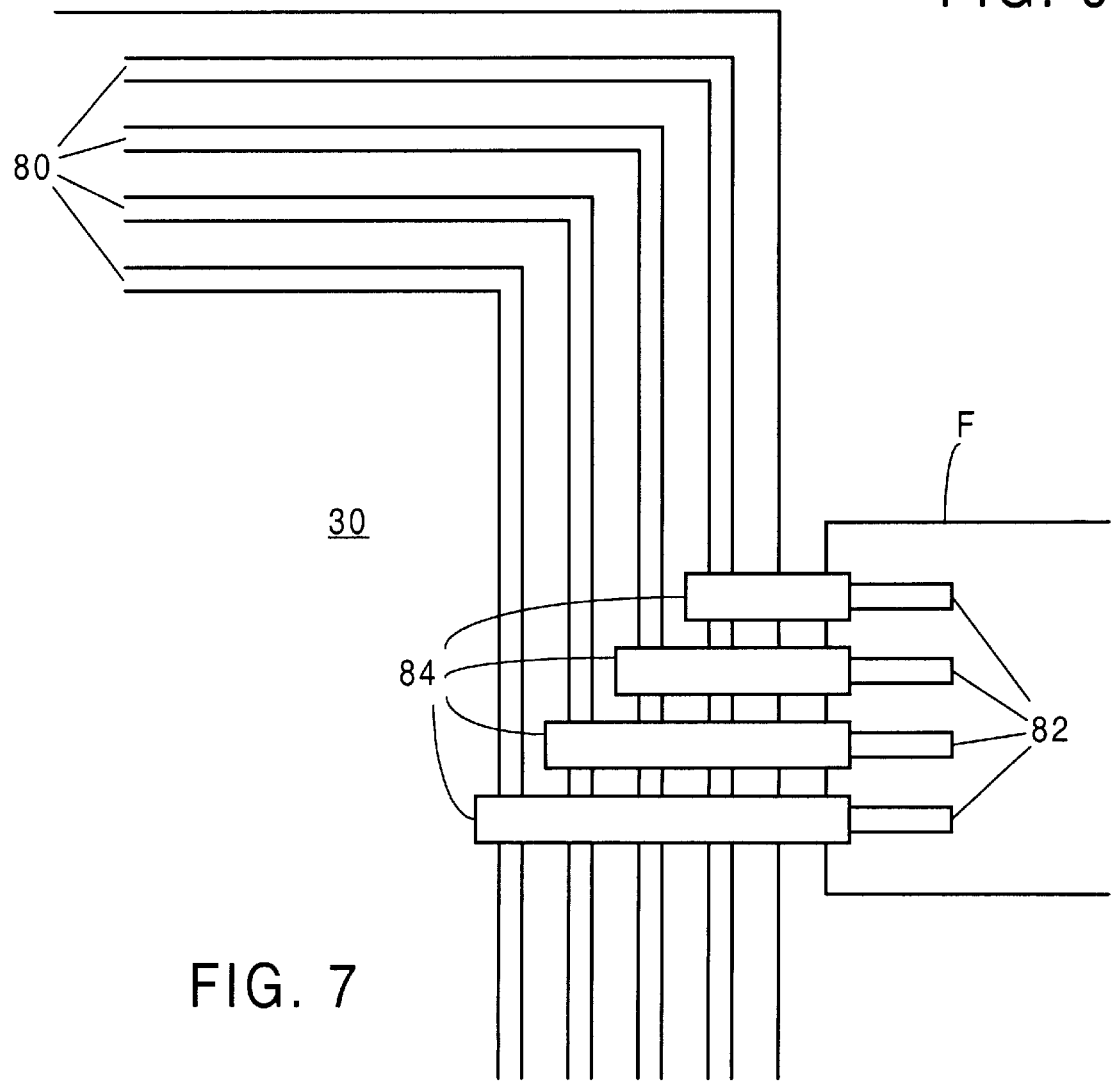

An alternative method for connecting a feature macro F to a base macro 30 is shown in FIGS. 6 and 7. In this embodiment, the discrete connection points 52 of FIGS. 4 and 5 are replaced by a set of concentric, continuous connection paths 80 which extend around the periphery of the base macro 30. In this manner, a feature macro F may be connected at any point around the periphery of the base macro 30 by connecting the connection points 82 of the feature macro F to corresponding connection paths 80 on the base macro 30 using appropriate conductive paths 84. The base macro 30 may be provided with multiple sets of the concentric connection paths 80 to allow a plurality of feature macros to be respectively connected thereto. Alternately, multiple feature macros may be connected to a single set of connection paths 80 if the base macro 30 is capable of differentiating between the plurality of feature macros. Further, connection paths which extend partially around the periphery of the base macro 30 in one or more locations may also be used without departing from the intended scope of the present invention.

The foregoing description of the present invention has been presented for purposes of illustration and description. It is not intended to be exhaustive or to limit the invention to the precise form disclosed, and obviously many modifications, variations, and equivalents are possible in light of the above teaching. Such modifications, variations, and equivalents that may be apparent to a person skilled in the art are intended to be included within the scope of this invention as defined by the accompanying claims.

We claim:

1. An apparatus comprising:
   a base hard macro surrounded by a plurality of generic connection points, the generic connection points being connectable to corresponding connection points on any of a plurality of selectable feature hard macros, wherein a connection of at least one of the selectable feature hard macros to the base hard macro determines a circuit function performed by the apparatus.

2. The apparatus according to claim 1, wherein each of said selectable feature hard macros includes predefined connection points corresponding to the generic connection points on said base hard macro.

3. The apparatus according to claim 1, wherein the generic connection points on said base hard macro are arranged into a plurality of ports, each said port including an identical set of said generic connection points.

4. The apparatus according to claim 1, wherein the generic connection points on said base hard macro are arranged into a plurality of ports, each said including an identical set of generic connecting points, and wherein of each of said selectable hard macros includes predefined connection points corresponding to the generic connection points on any of the ports on the base hard macro.

5. The apparatus according to claim 3, wherein said plurality of ports on said base hard macro are disposed about at least a portion of a periphery of said base hard macro.

6. The apparatus according to claim 3, wherein each of said plurality of ports on said base hard macro includes a connection point for receiving a signal indicating that one of said feature hard macros is attached thereto.

7. The apparatus according to claim 6, wherein said indicating signal is provided by the feature hard macro attached to the port.

8. An integrated circuit including:

a base hard macro surrounded by a plurality of generic connection points;

at least one selectable feature hard macro having corresponding connection points, wherein the generic connection points on said base hard macro are connectable to corresponding connection points on any of said selectable feature hard macros;

wherein a connection of at least one of the selectable feature hard macros to the base hard macro determines a circuit function performed by the integrated circuit.

9. The integrated circuit according to claim 8, wherein each of said selectable feature hard macros includes predefined connection points corresponding to the generic connection points on said base hard macro.

10. The integrated circuit according to claim 8, wherein the generic connection points on said base hard macro are arranged into a plurality of ports, each said port including an identical set of said generic connection points.

11. The integrated circuit according to claim 8, wherein the generic connection points on said base hard macro are arranged into a plurality of ports, each said port including an identical set of said generic connection points, and wherein each of said selectable feature hard macros includes predefined connection points corresponding to the generic connection points on any of the ports on the base hard macro.

12. The integrated circuit according to claim 10, wherein said plurality of ports on said base hard macro are disposed about at least a portion of a periphery of said base hard macro.

13. The integrated circuit according to claim 10, wherein each of said plurality of ports on said base hard macro includes a connection point for receiving a signal indicating that one of said feature hard macros is attached thereto.

14. The integrated circuit according to claim 13, wherein said indicating signal is provided by the feature hard macro attached to the port.

15. A method for providing a hard macro comprising the steps of:

providing a base hard macro surrounded by a plurality of generic connection points;

connecting corresponding connection points on any of a plurality of selectable feature hard macros to the generic connecting points on said base hard macro;

wherein a connection of at least one of the selectable feature hard macros to the base hard macro determines a circuit function performed by the hard macro.

16. The method according to claim 15, further including the step of:

providing each selectable feature hard macro with predefined connection points corresponding to the generic connection points on said base hard macro.

17. The method according to claim 15, further including the step of:

arranging the generic connection points on said base hard macro into a plurality of ports, each said port including an identical set of said generic connection points.

18. The method according to claim 17, further including the step of:

arranging said plurality of ports on said base hard macro about at least a portion of a periphery of said base hard macro.

19. The method according to claim 17, further including the step of:

generating a signal indicating that one of said plurality of selectable feature hard macros is attached to one of said plurality of ports.

20. The method according to claim 19, further including the step of:

providing each of said plurality of ports on said base hard macro with a connection point for receiving said indicating signal, wherein said indicating signal is generated by a feature hard macro attached thereto.

21. An apparatus comprising:

a base hard macro surrounded by a plurality of generic connection paths, the generic connection paths being connectable to corresponding connection points on any of a plurality of selectable feature hard macros, wherein a connection of at least one of the selectable feature hard macros to the base hard macro determines a circuit function performed by the apparatus.

22. The apparatus according to claim 21, wherein each of said selectable feature hard macros includes predefined connection points corresponding to the generic connection paths on said base hard macro.

23. The apparatus according to claim 21, wherein the plurality of generic connection paths are continuous about a periphery of said base hard macro.

24. The apparatus according to claim 23, wherein the plurality of generic connection paths concentric.

* * * * *